United States Patent [19]

Schreck et al.

[11] Patent Number: 5,287,536
[45] Date of Patent: Feb. 15, 1994

[54] NONVOLATILE MEMORY ARRAY WORDLINE DRIVER CIRCUIT WITH VOLTAGE TRANSLATOR CIRCUIT

[75] Inventors: John F. Schreck; Phat C. Truong; Benjamin H. Ashmore, Jr.; Harvey J. Steigler, all of Houston, Tex.

[73] Assignee: Texas Instruments Incorporated, Dallas, Tex.

[21] Appl. No.: 9,276

[22] Filed: Jan. 22, 1993

Related U.S. Application Data

[63] Continuation of Ser. No. 787,706, Nov. 4, 1991, abandoned, which is a continuation of Ser. No. 513,534, Apr. 23, 1990, abandoned.

[51] Int. Cl.$^5$ .................. G11C 16/06; G11C 5/14
[52] U.S. Cl. .................. 365/230.06; 365/189.09; 365/226; 365/185; 307/449; 307/452; 307/264
[58] Field of Search .................. 365/184, 185, 189.09, 365/189.11, 226, 230.06; 307/449, 452, 264

[56] References Cited

U.S. PATENT DOCUMENTS

| | | | |
|---|---|---|---|
| 4,368,524 | 1/1983 | Nakamura et al. | 365/185 |
| 4,583,205 | 4/1986 | Watanabe | 365/230.06 |
| 4,642,798 | 2/1987 | Rao | 365/230.06 |
| 4,677,590 | 6/1987 | Arakawa | 365/185 |
| 4,820,941 | 4/1989 | Dolby et al. | 307/452 |
| 4,823,318 | 4/1989 | D'Arrigo et al. | 365/218 |
| 4,864,591 | 9/1989 | Marquot | 365/185 |

*Primary Examiner*—Glenn Gossage
*Attorney, Agent, or Firm*—Theodore D. Lindgren; Leo N. Heiting; Richard L. Donaldson

[57] ABSTRACT

A circuit for driving a wordline or group of wordlines in a floating-gate type EEPROM cell array includes a read-driver subcircuit for switching positive read voltages, a program-driver subcircuit for switching positive programming voltages and, optionally, a subcircuit for switching negative erasing voltages. The read-driver subcircuit may be constructed using relatively short-channel transistors for relatively high speed operation when connected to high-capacitance wordlines. On the other hand, the program-driver subcircuit may be constructed using relatively long-channel transistors and those long-channel transistors may be located on the memory chip remotely from the memory cells and from the read-driver circuit. P channel isolating transistors are used to isolate unused circuitry during operation. A voltage translator in the program-driver subcircuit has a transistor configuration that lessens the probability that the breakdown voltages of those transistors will be exceeded. A method for programming nonvolatile memory cell arrays is also disclosed.

22 Claims, 2 Drawing Sheets

NONVOLATILE MEMORY ARRAY WORDLINE DRIVER CIRCUIT WITH VOLTAGE TRANSLATOR CIRCUIT

This application is a continuation of application Ser. No. 07/787,706, filed Nov. 4, 1991, now abandoned, which was a continuation of application Ser. No. 07/513,534, filed Apr. 23, 1990, now abandoned.

BACKGROUND OF THE INVENTION

This invention relates to circuitry for applying reading, programming and erasing voltages to the wordlines of nonvolatile memory arrays and, therefore, to the control gates of nonvolatile memory cells such as floating-gate-type, electrically erasable programmable read-only-memory (EEPROM) cells.

This application discloses and claims circuitry that is related to the wordline driver circuitry described in U.S. Pat. No. 4,820,941, issued Apr. 11, 1989; in U.S. Pat. No. 4,823,318, issued Apr. 18, 1989; and in U.S. patent application Ser. No. 07/909,526, which is a continuation of 07/692,802, now abandoned, which is a continuation of abandoned 07/382,356, now abandoned, all of which are assigned to Texas Instruments Incorporated.

EEPROM arrays of the type used with the circuitry of this application are described, for example, in copending U.S. patent application Ser. No. 07/274,718, now abandoned, which is a continuation of 07/056,196, now abandoned, Ser. No. 07/494,051 (which is a continuation of 07/219,528, now abandoned, and which issued as U.S. Pat. No. 5,017,980 on May 21, 1991); and Ser. No. 07/494,042 (which is a continuation of 07/219,529, now abandoned, and which issued as U.S. Pat. No. 5,008,721 on Apr. 16, 1991) and Ser. No. 07/494,060 (which is a continuation of 07/219,530, now abandoned, and which issued as U.S. Pat. No. 5,012,307 on Apr. 30, 1991); each of those applications being assigned to Texas Instruments Incorporated. EEPROM arrays of the type described in the foregoing applications require circuitry that will switch as many as four different values of voltage to each wordline for the purposes of reading, programming and erasing information stored on the floating gates. One of those voltages, the erasing voltage, must be negative with respect to the array bitlines or cell source-drain regions.

The various EEPROM wordline voltages may be generated from the external supply voltage Vcc (approx. +5 V) using charge-pumped capacitors located on the memory chip. Circuits for switching from one positive voltage to a second positive voltage are well-known. For example, circuits for changing the wordline voltage from one value of positive voltage to another value of positive voltage, and even to reference voltage, have been used during the change from program mode to read mode of operation of electrically-programmable read-only-memories (EPROMs). However, in the case of EEPROMs, there is a need for improved circuits that will not only switch wordline reading and programming voltages, but that will also switch negative erasing voltages to a selected wordline. Switching of negative voltages presents a unique problem in that such circuits must be designed to prevent P-N junctions between the diffused areas and the substrate of such integrated circuits from becoming forward-biased during application of negative erase voltages.

In addition, there is a need for circuitry that will supply a third value of positive voltage to deselected wordlines during program mode operation and, therefore, that decreases the probability of disturbing the programmed status of deselected memory cells.

Generally, the field-effect transistors used to drive wordlines during programming and/or erasing of memory cells must have a longer channel length than that of the field-effect transistors used during reading of those memory cells. The longer channel-lengths are required to prevent "punch-through" between source and drain caused by the higher voltages used during programming and erasing. In general, transistors with longer channels have slower operating times than transistors with shorter channels. Because previous wordline driver circuits have used at least some of the same driver transistors for both read mode and for write and/or erase mode operations, the speed of operation during read mode operation has been limited by the required longer channel length of those same transistors.

Also generally, the field-effect transistors used to drive wordlines during programming and/or erasing of memory cells must have thicker gate insulation than that of the field-effect transistors used during reading of those memory cells. The thicker gate insulation is required to prevent "field-plate" or "gated-diode" electric-field breakdown between gate conductor and the substrate caused by the higher voltages used during programming and erasing.

SUMMARY OF THE INVENTION

The driver circuit of this invention includes a read driver subcircuit for supplying positive read voltages to a wordline and includes a program driver subcircuit for supplying positive programming voltages to the wordline, an erase driver subcircuit for supplying negative erasing voltages to the wordline, and switches for connecting the subcircuit to the wordline.

The read-driver subcircuit may be constructed primarily using short-channel transistors for relatively high speed operation when connected to high-capacitance wordlines. On the other hand, the program and erase driver subcircuits may be constructed using relatively long-channel transistors, perhaps with relatively thick gate-insulation. The transistors of the program and erase subcircuits may be located remotely on the memory chip from the memory cells and from the read driver subcircuit, removing channel-length limitations in the memory-cell area, as well as allowing layout flexibility for purposes including isolation and use of thick-field devices. P-channel isolating transistors are used to switch the outputs of the subcircuits to the wordline, connecting the subcircuit in use and isolating the unused subcircuits during operations.

The program driver subcircuit includes a voltage-translator subcircuit having a configuration that allows a lower required field-plate, or gated-diode breakdown voltage for the field-effect transistors used in that subcircuit. Therefore, the transistors of that subcircuit may be constructed with relatively short channel-lengths and relatively thin gate insulators.

The circuit of this invention is of particular usefulness when used in conjunction with a segmented memory array such as that described in U.S. patent application Ser. No. 07/490,122, which is a continuation of 07/518,394, now abandoned, and which is also assigned to Texas Instruments Incorporated.

The invention also includes a method for programming nonvolatile memory arrays.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1A:
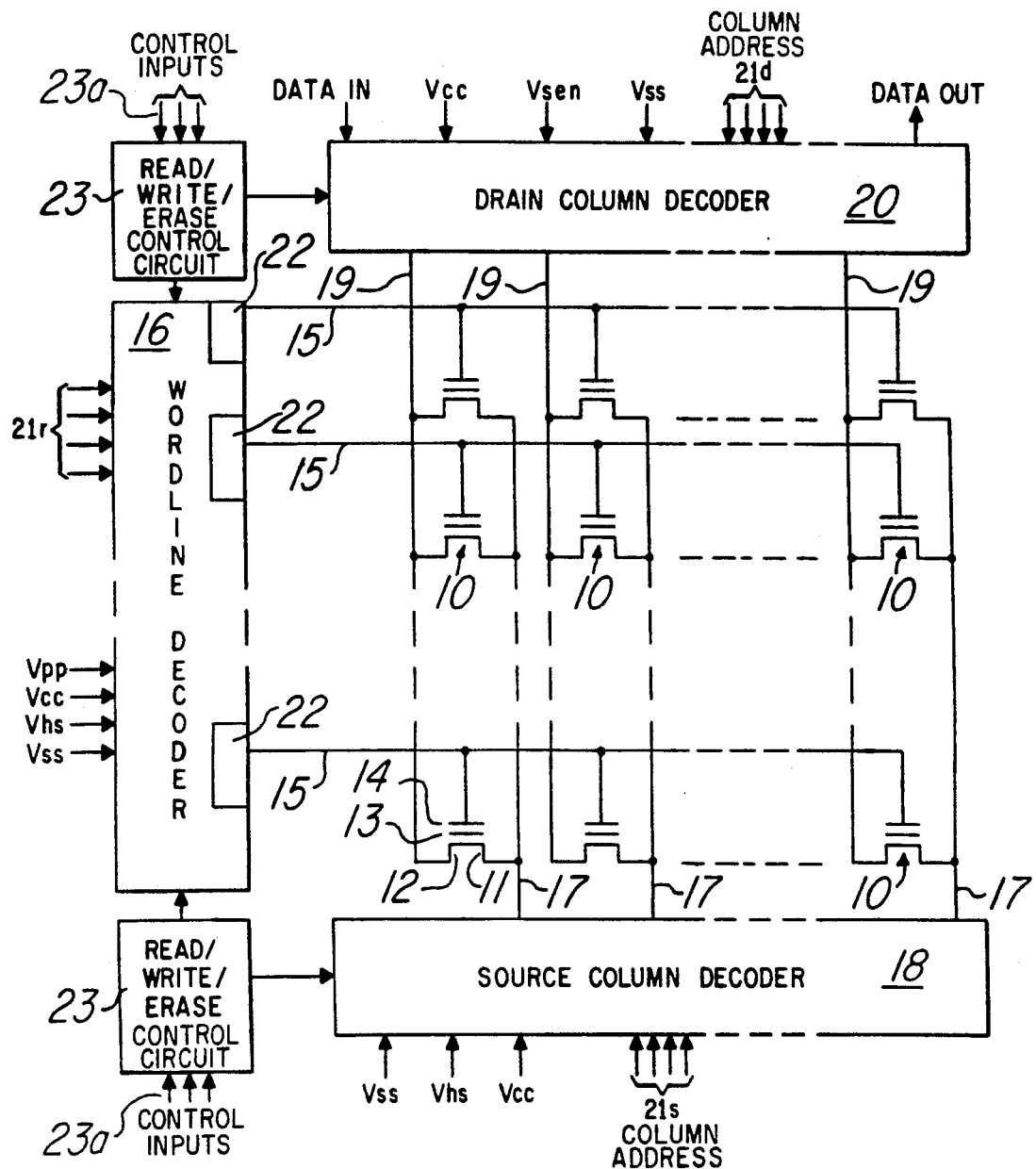
FIG. 1a illustrates a schematic diagram, in partial block form, of an exemplary nonvolatile memory array and associated circuitry that may include the wordline driver circuit of this invention.
Figure 1B:
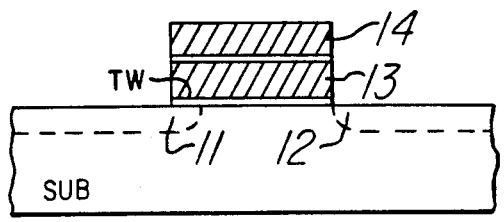
FIG. 1b illustrates a cross-sectional view of a typical prior-art memory cell formed on a substrate.

Referring to FIG. 1a, an exemplary array of memory cells, which is an integral part of a memory chip, is shown for the purpose of illustrating use of the circuit of this invention. Each cell is a floating-gate transistor 10 having a source 11, a drain 12, a floating gate 13 and a control gate 14. A cross-sectional view of a typical prior-art floating-gate transistor 10 is illustrated in FIG. 1b as formed on a substrate SUB. Each of the control gates 14 in a row of cells 10 is connected to a wordline 15, and each of the wordlines 15 is connected to a wordline decoder 16. Each of the source electrodes 11 in a column of cells 10 is connected to a source-column line 17 (bitline), and each of the source-column lines 17 is connected to a source-column decoder 18. Each of the drain electrodes 12 in a column of cells 10 is connected to a drain-column line 19 (bitline), and each of the drain-column lines 19 is connected to a drain-column decoder 20.

In program mode operation, the wordline decoder 16 may function, in response to wordline address signals on lines 21r, to place a preselected first programming voltage Vpp (approx. +16 to +18 V) on a selected wordline 15, including a selected control-gate conductor 14 of the selected cell 10. Drain-column decoder 20 functions, in response to bitline-address signals on lines 21d, to place a preselected second programming voltage (reference potential Vss or ground, or a non-negative voltage) on a selected drain-column line 19, which includes the drain region 12 of the selected cell 10. The wordline decoder 16 may, optionally and in response to wordline-address signals on lines 21r, place a third preselected voltage Vhs (approx. +7 V) on deselected wordlines 15, including deselected control-gate conductors 14 of the deselected cell 10. The third preselected voltage, or "half-select" voltage, Vhs should be sufficiently close to the second programming voltage that the floating-gate conductors 13 associated with the deselected wordlines 15 will not be programmed as a result, but should be sufficiently high that stress will be reduced across any tunnelling windows TW of cells in deselected wordlines 15, thereby avoiding de-programming of pre-programmed cells 10. Drain-column decoder 20 may also function to place a fourth preselected voltage, which may also be Vhs, on deselected drain-column lines 19. Source-column decoder 18, in response to bitline-address signals on lines 21s, functions to allow the selected source-column line 17 to float and may also function to place the fourth preselected voltage on deselected source-column lines 17. (In general, it is not necessary to place the fourth preselected voltage on both the source-column and the drain-column lines.) The positive voltage Vpp applied to the control gate 14 of the selected cell 10 causes the semiconductive source-drain path of the selected cell 10 to be conductive. Therefore, the source 11 of the selected cell 10 is at the same potential (Vss) as the drain 12 of that cell 10. The preselected second programming voltage Vss must differ sufficiently from the first preselected programming voltage Vpp that excess electrons will migrate, perhaps by Fowler-Nordheim tunneling, to the selected floating-gate conductor 13 and, as a result, program that selected floating-gate conductor 13. The third and fourth preselected voltages (Vhs) should be placed on the deselected wordlines 15 and the deselected source-column and/or drain-column lines 17/19 prior to placing both the first and second preselected voltages Vpp and Vss on their respective electrodes. The first programming voltage Vpp may be placed on the control-gate conductors 14 in a gradual manner so as to reduce voltage-induced stress on the selected cell 10. The floating gate 13 of the selected cell lo is charged with electrons during programming, and the electrons in turn render the source-drain path under the floating gate 13 of the selected cell 10 nonconductive, a state which is read as a "zero" bit. Deselected cells have source-drain paths under the floating gate 13 that remain conductive, and those cells are read as "one" bits.

During a flash-erase mode of operation, the source-column decoder 18 functions to apply a positive voltage Vcc (approx. +5 V) to all the source-column lines 17. The drain-column decoder 20 functions to leave all drain-column lines 19 floating. The wordline decoder 16 functions to apply a high negative voltage Vee (approx. −11 V) to all the wordlines 15. The excess electrons are removed from the floating gates 13 of programmed cells 10.

In the read mode of operation, the wordline decoder 16 functions, in response to wordline address signals on lines 21r, to apply a preselected positive voltage (approx. +3 V to +5 V, perhaps supply voltage Vcc) to the selected wordline 15, and to apply a low voltage (ground or Vss) to deselected wordlines 15. The drain-column decoder 20 functions, in response to drain-column-address signals on lines 21d, to apply a preselected positive voltage Vsen (approx. +1 V to +1.5 V) to the selected drain column 19 and to allow the deselected drain lines to float. The source-column decoder 18 functions to connect all source-column lines 17 to ground (or Vss). The conductive or nonconductive state of the cell 10 connected to the selected drain-column line 19 and the selected wordline 15 is detected by a sense amplifier (not shown) connected to the DATA OUT terminal.

The voltages applied to the source 11 and drain 12 regions in the read example above are interchangeable. In addition, programming and erasing may be performed at the drain region 12 with corresponding changes in voltages, if the device is structured so that tunneling of electrons takes place between the drain region 12 and the floating gate 13. The terms "source" and "drain" as used herein are interchangeable for each mode of operation of the memory array.

For convenience, a table of read, write and flash erase voltages is given in the TABLE I below:

TABLE I

| | Read | Program | Flash Erase |
|---|---|---|---|
| Selected Wordline | 3–5V | 16–18V | −11V (All) |
| Deselected Wordlines | 0V | 7V | |
| Selected Source Line | 0V | Float | 5V (All) |
| Deselected Source Lines | 0V | 7V | |
| Selected Drain Line | 1–1.5V | 0V | Float (All) |
| Deselected Drain Lines | Float | 7V | |

The wordline decoder 16 includes wordline-driver circuits 22 that, in response to signals from lines 21r and from Read/Write/Erase control circuit 23, apply appropriate voltages Vpp, Vhs, Vcc or Vss to wordlines 15 during program, erase and read mode operations. Read/Write/Erase control circuit 23 is controlled by CONTROL SIGNALS inputs 23a from a microprocessor, not shown. The wordline-decoder circuit 16, including the wordline driver circuits 22, may be located remotely from each other and from the memory array. In a memory array formed from segments or groups of memory cells, corresponding wordlines 15 of those segments may be connected in parallel. The wordline-driver circuit 22 may drive the parallel connection of wordlines 15.

FIG. 1b illustrates a cross-section view of a typical prior-art memory cell formed on a substrate SUB having a tunnelling window TW.

Figure 2:
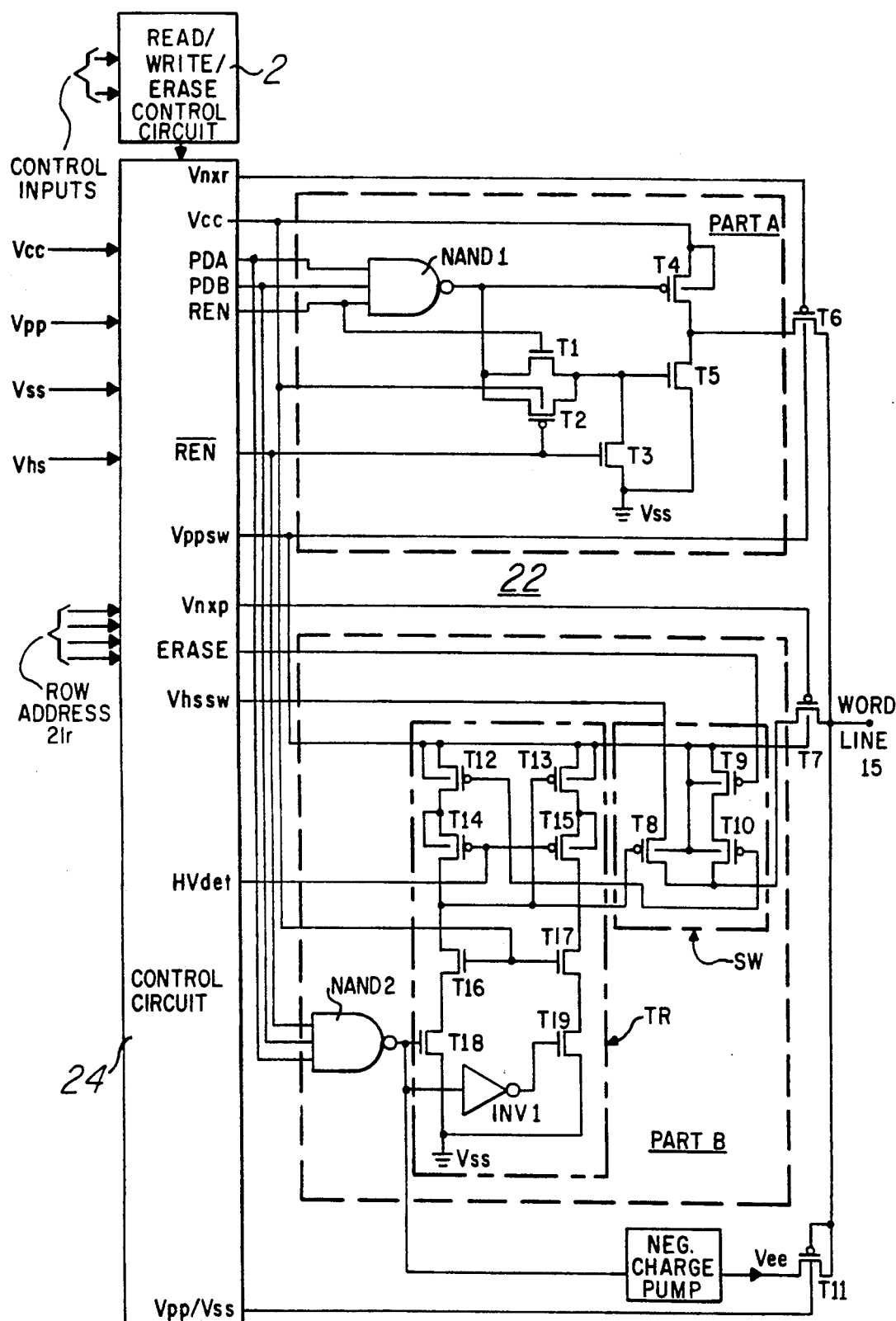
FIG. 2 a schematic embodiment of the wordline driver circuit of this invention.

Referring now to FIG. 2, the wordline-driver circuit 22 of this invention includes subcircuits designated PART A and PART B. The signals at the Vnxr, PDA, PDB, REN, $\overline{REN}$, Vnxp, and ERASE terminals of the wordline-driver circuit 22 of FIG. 2 are furnished by control circuit 24 using signals derived from the input signals from lines 21r and from the Read/Write/Erase control circuit 23. The PART A subcircuit is used to drive the WORDLINE terminal 15 during read mode operation. It is desirable that the PART A subcircuit be capable of operating at a relatively high speed of operation. The PART B subcircuit is used to drive the WORDLINE terminal 15 during program mode operations, those operations generally requiring higher voltages than those of read mode operation. Because of the low voltages required for read mode operation, the transistors T1–T5 of the PART A subcircuit may be constructed with the minimum-length lithographic dimensions (e.g., with the shortest possible channel-length) used to construct the memory cells of the integrated-circuit device. Use of channel-lengths substantially equal to the minimum-length lithographic dimensions increases speed of operation, or permits the PART A subcircuit to drive a higher capacitance associated with the WORDLINE terminal 15. The transistors T8–T10 and T12–T19 used in the PART B subcircuit, as well as switching transistors T6–T7 and T11, generally require larger dimensions (longer channels) because of the higher voltages used in that PART B subcircuit and transistor T6–T7 and T11. Transistors T6–T19 may, for example, have channel-lengths in the range of perhaps one to two times the minimum lithographic dimension used for manufacture of the memory cell array. However, the PART B subcircuit may be located remotely on a common substrate from the PART A subcircuit and from the memory array transistors 10 for the purpose of minimizing the total area used by the entire memory chip. In addition, the transistors T6–T19 may have thicker gate insulators, or oxides, than the transistors of the PART A subcircuit and the memory transistors 10.

In reference to the PART A subcircuit of FIG. 2, the NAND element, designated NAND1, has three input terminals connected to terminals PDA, PDB and REN of control circuit 24, and has an output terminal connected to commonly connected source-drain terminals of N channel transistor T1 and P channel transistor T2. The tank, which is a P type well diffused into the substrate, of P channel transistor T2 is connected to terminal Vcc. The gate terminal of N channel transistor T1 is also connected to terminal REN. The gate terminal of P channel transistor T2 is connected to terminal $\overline{REN}$, and to the gate terminal of N channel transistor T3. The other common source-drain terminal of N channel transistor T1 and P channel transistor T2 is connected to a source-drain terminal of transistor T3. The other source-drain terminal of transistor T3 is connected to reference potential Vss, indicated as ground. The output terminal of NAND1 element is also connected to the gate terminal of P channel transistor T4. A source-drain terminal and the tank of P channel transistor T4 are connected to terminal Vcc. The other source-drain terminal of transistor T4 is connected to a source-drain terminal of N channel transistor T5. The output of the PART A subcircuit is taken from the common source-drain terminals of transistors T4 and T5 and is connected to a source-drain terminal of a switch, shown as P channel transistor T6. The gate terminal of N channel transistor T5 is connected to the commonly connected source-drain terminals of transistors T1, T2 and T3. The other source-drain terminal of N channel transistor T5 is connected to reference voltage Vss.

The other source-drain terminal of P channel switching transistor T6 is connected to the WORDLINE terminal. The gate terminal of P channel transistor T6 is connected to read enable signal terminal Vnxr. The tank of P channel transistor T6 is connected to terminal Vppsw.

A circuit similar to the PART A subcircuit of FIG. 2 is described in the aforementioned U.S. Pat. No. 4,820,941, issued Apr. 11, 1989 and assigned to Texas Instruments Incorporated.

The output of the PART B subcircuit of FIG. 2 is connected to one source-drain terminal of P channel switching transistor T7. P channel transistor T7 has a gate terminal connected to program enable signal terminal Vnxp, and another source-drain terminal connected to terminal WORDLINE.

The output of the PART B subcircuit is taken from one of the connections to one source-drain terminal of P channel transistor T8. The tank of P channel transistor T8 is connected to terminal Vppsw. Another source-drain terminal of P channel transistor T8 is connected to terminal Vhssw. One source-drain terminal of transistor T9 is connected to terminal Vppsw. The other source-drain terminal of P channel transistor T9 is connected to a source-drain terminal of P channel transistor T10. The other source-drain terminal of P channel transistor T10 is connected to the commonly connected source-drain terminals of P channel transistors T7 and T8. The gate terminal of P channel transistor T9 is connected to terminal ERASE.

Referring briefly to the erasing subcircuit of the driver circuit 22 source-drain terminal and the gate terminal of P channel switching transistor T11 are connected to the terminal designated WORDLINE. The other source-drain terminal of P channel transistor T11 is connected to the output of a negative voltage supply designated, NEG. CHARGE PUMP. The NEG. CHARGE PUMP voltage supply provides a pulsed negative voltage Vee during erasure. When not providing the negative voltage pulse, the output of the NEG. CHARGE PUMP voltage supply provides a high impedance at its output terminal. A separate NEG. CHARGE PUMP voltage supply may be formed with each PART B subcircuit, or, where several driver circuits 22 are formed to served segments of a memory array, for example, one NEG. CHARGE PUMP voltage supply may be used for several driver circuits 22. The tank of transistor T11 is connected to voltage Vpp during read and program mode operations and to reference potential Vss during erase mode operation.

Referring now to the translator subcircuit TR of the PART B subcircuit of FIG. 2, P channel transistors T12 and T13 each have one source-drain terminal connected to terminal Vppsw. The other source-drain terminal of P channel transistor T12 is connected to one source-drain terminal of P channel transistor T14. The other source-drain terminal of P channel transistor T13 is connected to one source-drain terminal of P channel transistor T15. The other source-drain terminal of P channel transistor T14 is connected to one source-drain terminal of N channel transistor T16 and the other source-drain terminal of P channel transistor 15 is connected to one source-drain terminal of N channel transistor 17. The other source-drain terminal of N channel transistor T16 is connected to one source-drain terminal of N channel transistor T18. The other source-drain terminal of N channel transistor T17 is connected to one source-drain terminal of N channel transistor T19. The other source-drain terminals of N channel transistors T18 and T19 are connected to reference potential Vss.

A first output of the PART B subcircuit is taken from commonly connected source-drain terminals of P channel transistor T14 and N channel transistor T16. The first output is also connected to the gate terminal of P channel transistor T13. The second output of the subcircuit TR is taken from commonly connected source-drain terminals of P channel transistor T15 and N channel transistor T17. The second output is also connected to the gate terminal of P channel transistor T12. The gate terminals of P channel transistors T14 and T15 are connected to terminal HVdet. The gate terminals of N channel transistors T16 and T17 are connected to terminal Vcc.

The first and second outputs of the subcircuit TR are connected to the gate terminals of transistors T8 and T10 respectively of switching subcircuit SW.

The tanks of P channel transistors T8, T9, T10, T12 and T13 are connected to terminal Vppsw. The tank of P channel transistor T14 is connected to the commonly connected source-drain terminal of P channel transistors T12 and T14. The tank of P channel transistor T15 is connected to the commonly connected source-drain terminals of P channel transistors T13 and T15.

The NAND element designated NAND2 has three inputs connected to terminals PDA, PDB and $\overline{REN}$, respectively. The output of the NAND2 element is connected to provide an enabling signal to the gate terminal of N channel transistor T18 and, through inverter circuit designated INV1, to provide an inverted enabling signal to the gate terminal of N channel transistor T19. The output of the NAND2 element is also connected to an input of the negative voltage supply designated NEG. CHARGE PUMP.

During read mode operation, voltage supplies connected to the Vppsw, Vhssw and Vcc terminals may have the same value (about 5 volts). The signal voltage applied to the Vnxp terminal may also be about 5 volts, which causes device T7 to isolate PART B of the driver circuit from the WORDLINE terminal. The signal voltage applied to the Vnxr terminal is about −4 volts, allowing both high-level voltage (Vcc) and low-level voltage (ground or 0 volts) to be transferred to the WORDLINE terminal by PART A of the driver circuit. The signal at the REN terminal, which may be considered a reading control signal, is equal to the voltage (about 5 volts) at the Vcc terminal. The signal at the $\overline{REN}$ terminal, which may be considered a programming control signal and is the converse of the signal at the REN terminal, is at ground (Vss or 0 volts). The signal at the REN terminal enables the NAND1 element. The NAND1 element decodes the signals PDA and PDB from a wordline select circuit (not shown). The signal at the $\overline{REN}$ terminal disables the NAND2 element, preventing the rest of the PART B subcircuit from switching. A high-speed read mode operation is generally desired for driver circuitry connected to the WORDLINE terminal during reading of selected wordlines. Therefore, devices T4, T5 and T6 should be chosen to drive the WORDLINE terminal of the memory array rapidly.

During program and erase mode operations, the signal at the $\overline{REN}$ terminal is high (about 5 volts), and the signal at the REN terminal is low (0 volts or ground). The low signal at the REN terminal disables the NAND1 element, which prevents the PART A circuitry from switching. The high signal at the $\overline{REN}$ terminal enables the NAND2 element. The NAND2 element decodes signals PDA and PDB from a wordline decoder circuit (not shown).

During program mode operation, the Vnxr terminal is at about 18 volts (Vpp), which causes device T6 to isolate PART A subcircuit from the WORDLINE terminal (the WORDLINE terminal is either at about 18 volts or at about 7 volts during program mode operation). It is noted here that devices T4 and T5 are nonconductive during program mode operation, which allows a maximum of Vpp-(Vcc plus one diode voltage drop) as the breakdown voltage that may exist on device T6.

During erase mode operation on a selected wordline, the Vnxr terminal is at ground (0 volts), which causes device T6 to isolate PART A subcircuit from the WORDLINE terminal. The WORDLINE terminal of the driver circuit 22 is at about −11 volts during erase mode operation on a selected WORDLINE. However, during an erase mode operation in which the wordline connected to a driver circuit 22 is deselected, the WORDLINE terminal is at Vcc (about 5 volts). Therefore, T6 is conductive during erase mode operation of the driving circuit on a deselected wordline, but both devices T4 and T5 are nonconductive, which isolates the PART A subcircuit from the WORDLINE terminal. The sources 11/drains 12 of devices T4 and T5 never see a voltage level lower than Vss plus a P channel voltage threshold. Therefore, the voltage breakdown requirement of T4 is reduced and the relevant PN junction of T5 is not forward biased.

During program mode operation, the PART B subcircuit is enabled by a high signal (about 5 volts) at the REN terminal, by Vpp (about 18 volts) and by Vhs (about 7 volts). The output of the NAND2 element is either at ground (0 volts) or at Vcc (about 5 volts). These outputs will become, at the WORDLINE terminal, either Vss (ground or volts), Vpp (pulsed to about 18 volts), or Vhssw (switched to about 7 volts), when translated by the translator subcircuit TR (including devices T12, T13, T14, T15, T16, T17, T18, T19 and INV1). The signal at the HVdet terminal changes from Vss (0 V) to Vcc (about 5 volts) during program mode operation. Isolation devices T14, T15, T16, and T17 act to reduce the voltage applied to translator subcircuit TR devices, thereby decreasing the "field-plate" or "gated-diode" breakdown voltage requirements for construction of the field-effect transistors of that circuit. Translator subcircuit TR switches high voltage Vpp during program mode operation using signal inputs from the NAND2 element having potentials equal to Vss and supply voltage-level-signal Vcc. The signal at the Vnxp terminal is at ground (0 volts) during program mode operation, causing switching transistor T7 to conduct.

Optional switching circuit SW (including devices T8, T9 and T10) allows the switched half-select voltage Vhssw to be switched to the WORDLINE terminal. Depending on whether T8 is conductive (deselected wordline) or T10 is conductive (selected wordline), the WORDLINE terminal is either at Vhs (7 volts) or at Vpp (18 volts), respectively.

During erase mode operation, voltage supplies at terminals Vhssw and Vppsw are at 5 volts. The negative charge pump is enabled if the WORDLINE terminal is connected to a selected wordline. Device T8 is nonconductive because of the 5 volt signal from the output of translator circuit TR. Device T9 is nonconductive because of a 5 volt signal from the ERASE terminal of control circuit 24. The signal at the Vnxp terminal is at ground (0 volts). Therefore, the WORDLINE terminal is pumped through device T11. If the WORDLINE terminal is connected to a deselected wordline, the negative pump is disabled and the voltage at the WORDLINE terminal is pulled to the value of the supply voltage Vcc at the Vhssw terminal, (about 5 volts) by devices T7 and T8.

During read and erase mode operations, the signal at the HVdet terminal is at ground (0 volts) and, therefore, the translator subcircuit TR does not have a floating node. During program mode operation, the signal at the HVdet terminal is also at ground (0 volts) until the time that Vpp reaches a voltage higher than 10 volts. At that time, a detector circuit (not shown) causes the signal at the HVdet terminal to go high (i.e., about 5 volts), allowing the translator subcircuit TR to operate correctly during the time periods in which Vpp is less than 10 volts, but preventing a large breakdown voltage during the time periods in which Vpp is greater than 10 volts.

For convenience, the input voltages for driver circuit 22 are given in TABLE II below:

TABLE II

|        | Read | Program | Erase |
|--------|------|---------|-------|
| Vppsw  | 5V   | 18V     | 5V    |
| Vhssw  | 5V   | 7V      | 5V    |
| Vcc    | 5V   | 5V      | 5V    |
| Vnxp   | 5V   | 0V      | 0V    |
| Vnxr   | −4V  | 18V     | 0V    |
| REN    | 5V   | 0V      | 0V    |
| REN_   | 0V   | 5V      | 5V    |

TABLE II-continued

|        | Read | Program | Erase |
|--------|------|---------|-------|
| HVdet  | 0V   | 0V, 5V  | 0V    |
| ERASE  | 0V   | 0V      | 5V    |

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for selectively applying a supply voltage and a programming voltage to a wordline of a nonvolatile memory array, said circuit comprising:
   a supply voltage terminal for supplying said supply voltage;
   a control circuit for respectively providing a reading control signal, a programming control signal, and a programming voltage output for supplying said programming voltage;
   a read mode subcircuit having an input connected to said supply voltage terminal and having a read mode output for selectively outputting said supply voltage in response to said reading control signal;
   a program mode subcircuit having an input connected to said programming voltage output and having a program mode output for selectively outputting said programming voltage in response to said programming control signal;
   a second signal-transistor switch connected between said program mode output and said wordline, said second single-transistor switch having a control input connected to a program enable signal output of said control circuit.

2. The circuit of claim 1, wherein said program mode subcircuit includes
   a translator subcircuit having an enabling input coupled to said programming control signal of said control circuit, said translator subcircuit having a translator output; and
   a switching circuit having a control input connected to said translator output, having an input connected to said programming voltage output, and having an output connected to said program mode output.

3. The circuit of claim 1, wherein said program mode subcircuit includes a translator subcircuit having an enabling input coupled to said programming control signal of said control circuit, a programming voltage input connected to said programming voltage output of said control circuit, and a translator output, and further includes a switching subcircuit having an input connected to said translator output; and wherein said translator subcircuit selectively couples said translator output to said programming voltage output of said control circuit in response to said programming control signal at said enabling input.

4. The circuit of claim 1, wherein said memory cell array has a minimum lithographic dimension, wherein said program mode subcircuit includes a translator subcircuit having a field-effect transistor that has a channel length longer than said minimum lithographic dimension of said memory cell array.

5. The circuit of claim 1, wherein said memory cell array has a minimum lithographic dimension, wherein said read mode subcircuit includes a field-effect transistor that has a channel-length substantially equal to said minimum lithographic dimension of said memory cell array.

6. The circuit of claim 1, wherein said memory cell array includes memory cells having a first gate insulator thickness, wherein said program mode subcircuit includes a field-effect transistor that has a second gate insulator thickness greater than said first gate insulator thickness.

7. The circuit of claim 1, wherein said memory cell array includes a memory cell having a first gate insulator thickness that defines a maximum gate insulator thickness for the memory cell array, wherein said read mode subcircuit includes at least one field-effect transistor having a second gate insulator thickness, and wherein said second gate insulator thickness is substantially equal to said first gate insulator thickness.

8. The circuit of claim 1, wherein said program mode subcircuit and said memory array are formed on a substrate and wherein said program mode subcircuit is formed on said substrate at a distance from said memory cell array.

9. The circuit of claim 1, wherein said read mode subcircuit and said memory array are formed on a substrate and wherein said read mode subcircuit is formed on said substrate at a distance from said memory ell array.

10. The circuit of claim 1, wherein said program mode subcircuit includes a translator having first and second translator outputs and having an enabling input, said translator subcircuit comprising:
a first transistor of a first conductivity type having a first source-drain, a second source-drain and a gate, said first source-drain connected to said programming voltage output of said control circuit,
a second transistor of said first conductivity type having a first source-drain, a second source-drain and a gate, said first source-drain of said second transistor connected to said programming voltage output of said control circuit;
a third transistor of said first conductivity-type having a first source-drain, a second source-drain and a gate, said first source-drain of said third transistor connected to said second source-drain of said first transistor, and said gate of said third transistor connected to a high voltage detect output of said control circuit;
a fourth transistor of said first conductivity-type having a first source-drain, a second source-drain and a gate, said first source-drain of said fourth transistor connected to said second source-drain of said second transistor, and said gate of said fourth transistor connected to said high voltage detect output of said control circuit;
a fifth transistor of said second conductivity-type opposite said first conductivity-type, having a first source-drain, a second source-drain and a gate, said first source-drain of said fifth transistor connected to said second source-drain of said third transistor, to said gate of said second transistor, and to said first translator output and said gate of said fifth transistor connected to said supply voltage terminal;
a sixth transistor of said second conductivity-type having a first source-drain, a second source-drain and a gate, said first source-drain of said sixth transistor connected to said second source-drain of said fourth transistor, to said gate of said first transistor, and to said second output of said translator subcircuit and said gate of said sixth transistor connected to said supply voltage terminal;
a seventh transistor of said second conductivity-type having a first source-drain, a second source-drain and a gate, said first source-drain of said seventh transistor connected to said second source-drain of said fifth transistor, said second source-drain of said seventh transistor connected to a reference voltage, and said gate of said seventh transistor connected to said enabling input;
an inverter having an input connected to said enabling input and having an inverter output;
an eighth transistor of said second conductivity-type having a first source-drain, a second source-drain and a gate, said first source-drain of said eighth transistor connected to said second source-drain of said sixth transistor, said second source-drain of said eighth transistor connected to said reference voltage, and said gate of said eighth transistor connected to said inverter output; and
a switch circuit having control inputs connected to said first and second translator outputs for selectively connecting said programming voltage output of said control circuit to said program mode output.

11. The circuit of claim 1, wherein said control circuit includes a half-select voltage output and wherein said program mode subcircuit includes:
a translator subcircuit having an enabling input coupled to said programming control signal, said translator subcircuit having two translator outputs; and
a switching circuit having two control inputs respectively connected to said two translator outputs, having two inputs respectively connected to said programming voltage output of said control circuit and said half-select voltage output of said control circuit, and having a switching output connected to said program mode output.

12. The circuit of claim 1, wherein said control circuit includes a half-select voltage output and wherein said program mode subcircuit includes:
a translator subcircuit having an enabling input coupled to said programming control signal, said translator subcircuit having first and second translator outputs; and
a switching circuit comprising:
a first transistor having a first source-drain, a second source-drain and a gate, said gate connected to said first translator output and said first source-drain connected to said half-select voltage output of said control circuit; and
a second transistor having a first source-drain, a second source-drain and a gate, said gate of said second transistor connected to said second translator output, said first source-drain of said second transistor connected to said programming voltage output of said control circuit, said second source-drain of said second transistor connected to said second source-drain of said first transistor and to said program mode output.

13. The circuit of claim 1, wherein said circuit for applying supply and programming voltage also applies erasing voltages to said wordline; wherein said control circuit includes a half-select voltage output and an erase signal output and wherein said program mode subcircuit includes:

a translator subcircuit having an enabling input coupled to said programming control signal, said translator subcircuit having first and second translator outputs; and a switching circuit comprising:

a first transistor having a first source-drain, a second source-drain and a gate, said gate connected to said first translator output and said first source-drain connected to said half-select voltage output of said control circuit;

a second transistor having a first source-drain, a second source-drain and a gate, said gate of said second transistor connected to said second translator output, said second source-drain of said second transistor connected to said second source-drain of said first transistor and to said program mode output; and a third transistor having a first source-drain, a second source-drain and a gate, said gate of said third transistor connected to said erase signal output of said control circuit, said first source-drain of said third transistor connected to said programming voltage output of said control circuit, said second source-drain of said third transistor connected to said first source-drain of said second transistor.

14. The circuit of claim 1, wherein said first and second single-transistor switches are gated field-effect transistors.

15. The circuit of claim 1, wherein said first single-transistor switch is a field-effect transistor having a first source-drain, a second source-drain and a gate, wherein said first source-drain is connected to said read-mode output, said second source-drain is connected to said wordline, and said gate is connected to said read enable output of said control circuit.

16. The circuit of claim 1, wherein said second single-transistor switch is a field-effect transistor having a first source-drain, a second source-drain and a gate, wherein said first source-drain is connected to said program mode output, said second source-drain is connected to said wordline, and said gate is connected to said program enable output of said control circuit.

17. The circuit of claim 1, wherein said circuit for applying supply and programming voltages also applies erasing voltages to said wordline, wherein said program mode subcircuit has an enabling input and said circuit for applying supply and programming voltages further includes:

a negative charge pump having a control input and having an erasing voltage output, said control input of said negative charge pump connected to said enabling input, and a third single-transistor switch connected between said erasing voltage output of said negative charge pump and said wordline, said third single-transistor switch having a control input connected to said wordline.

18. The circuit of claim 1, wherein said circuit for applying supply and programming voltages also applies erasing voltages to said wordline, and wherein said program mode subcircuit has an enabling input and said circuit for applying supply and programming voltages further includes:

a negative charge pump having a control input and having an erasing voltage output, said control input of said negative charge pump connected to said enabling input; and a field effect transistor having a first source-drain, a second source-drain and a gate, wherein said first source-drain is connected to said erasing voltage output of said negative charge pump, and said second source-drain and gate are connected to said wordline.

19. A translator circuit for translating a supply-voltage-level signal to a programming-voltage-level signal, said translator circuit having first and second outputs, an enabling input, a supply voltage input, a programming voltage input, a reference voltage input, and a high-voltage detect input; said translator circuit comprising:

a first transistor of a first conductivity type including first and second source-drains and a gate, said first source-drain connected to said programming voltage input;

a second transistor of said first conductivity-type including first and second source-drains and a gate, said first source-drain of said second transistor connected to said programming voltage input;

a third transistor of said first conductivity-type including first and second source-drains and a gate, said first source-drain of said third transistor connected to said second source-drain of said first transistor, and said gate of said third transistor connected to said high voltage detect input;

a fourth transistor of said first conductivity-type including first and second source-drains and a gate, said first source-drain of said fourth transistor connected to said second source-drain of said second transistor, and said gate of said fourth transistor connected to said high voltage detect input;

a fifth transistor of a second conductivity-type opposite said first conductivity-type, including first and second source-drains and a gate, said first source-drain of said fifth transistor connected to said second source-drain of said third transistor, to said gate of said second transistor, and to said first output of said translator circuit and said gate of said fifth transistor connected to said supply voltage input;

a sixth transistor of said second conductivity-type including first and second source-drains and a gate, said first source-drain of said sixth transistor connected to said second source-drain of said fourth transistor, to said gate of said first transistor, and to said second output of said translator circuit and said gate of said sixth transistor connected to said supply voltage input;

a seventh transistor of said second conductivity-type including first and second source-drains and a gate, said first source-drain of said seventh transistor connected to said second source-drain of said fifth transistor, said second source-drain of said seventh transistor connected to said reference voltage input, and said gate of said seventh transistor connected to said enabling input;

an inverter having an input connected to said enabling input and having an output;

an eighth transistor of said second conductivity-type including first and second source-drains and a gate, said first source-drain of said eighth transistor connected to said second source-drain of said sixth transistor, said second source-drain of said eighth transistor connected to said reference voltage input, and said gate of said eighth transistor connected to said output of said inverter.

20. The translator circuit of claim 19, wherein said first conductivity-type is P-type and said second conductivity-type is N-type.

21. The translator circuit of claim 19, wherein the translator circuit has a transistor having a first channel length, and wherein the translator circuit includes a second transistor having a channel length that is longer than said first channel length.

22. The translator circuit of claim 19, wherein said translator circuit has a transistor having a first gate insulator thickness, and wherein said translator circuit has a second said transistor having a gate insulator that is thicker than said first gate insulator thickness.

* * * * *